(12) United States Patent
Wu et al.

(10) Patent No.: US 8,029,900 B2
(45) Date of Patent: Oct. 4, 2011

(54) THERMAL INTERFACE MATERIAL AND METHOD FOR MANUFACTURING SAME

(75) Inventors: Yang Wu, Beijing (CN); Hua Huang, Beijing (CN); Chang-Hong Liu, Beijing (CN); Shou-Shan Fan, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 1135 days.

(21) Appl. No.: 11/478,920

(22) Filed: Jun. 30, 2006

(65) Prior Publication Data

US 2010/0243227 A1    Sep. 30, 2010

(30) Foreign Application Priority Data

Jul. 1, 2005 (CN) .......................... 2005 1 0035752

(51) Int. Cl.
*B32B 9/00* (2006.01)

(52) U.S. Cl. .................... 428/408; 977/742; 165/185
(58) Field of Classification Search ............ 428/408; 423/445 R, 447.1, 447.2; 165/185; 977/742
See application file for complete search history.

(56) References Cited

U.S. PATENT DOCUMENTS

| 6,407,922 | B1 | 6/2002 | Eckblad et al. |
| 2003/0096104 | A1 | 5/2003 | Tobita et al. |
| 2003/0111333 | A1 | 6/2003 | Montgomery et al. |
| 2004/0009353 | A1 * | 1/2004 | Knowles et al. ............ 428/411.1 |
| 2004/0097635 | A1 | 5/2004 | Fan et al. |
| 2004/0131835 | A1 | 7/2004 | Schmitt et al. |
| 2004/0266065 | A1 * | 12/2004 | Zhang et al. ................. 438/122 |

FOREIGN PATENT DOCUMENTS

| JP | 09298260 | 11/1997 |
| JP | 11054677 | 2/1999 |
| JP | 2002088257 | 3/2002 |
| JP | 2002273741 | 9/2002 |
| JP | 2004161996 | 6/2004 |
| JP | 2004165665 | 6/2004 |
| TW | 232286 | 5/2005 |
| WO | WO03/054958 A1 | 7/2003 |

* cited by examiner

*Primary Examiner* — David Sample
*Assistant Examiner* — Daniel H Miller
(74) *Attorney, Agent, or Firm* — Altis Law Group, Inc.

(57) ABSTRACT

One embodiment of a thermal interface material includes a plurality of carbon nanotubes each having a first end and an opposite second end, a heat current collector covering one of the first ends and the second ends of the carbon nanotubes, and a macromolecular material filled in spaces between the carbon nanotubes and heat current collector. A method for manufacturing a thermal interface material is also provided.

10 Claims, 2 Drawing Sheets

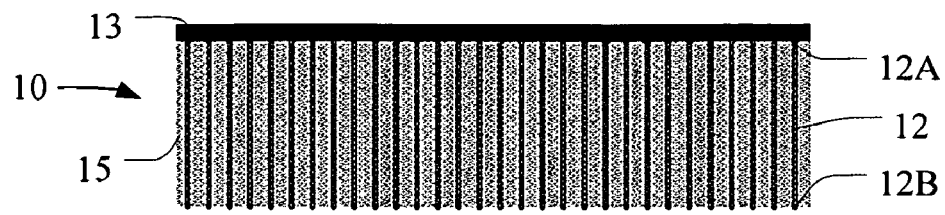
FIG. 1
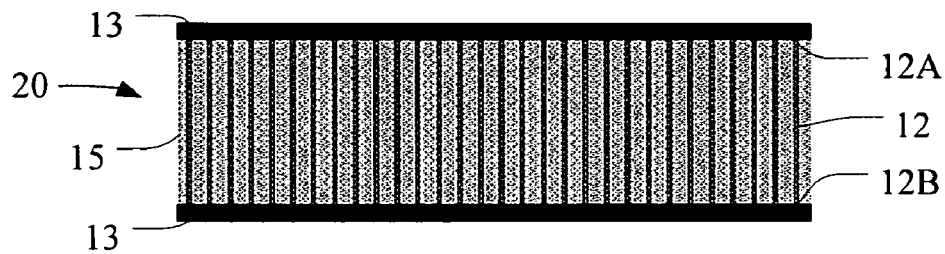
FIG. 2
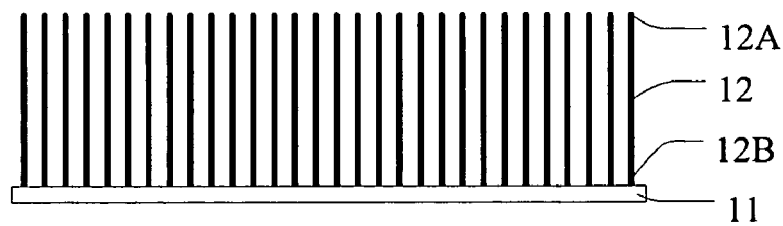
FIG. 3
FIG. 4

THERMAL INTERFACE MATERIAL AND METHOD FOR MANUFACTURING SAME

CROSS-REFERENCE TO RELATED APPLICATIONS

This application is related to six corresponding U.S. patent applications having the following titles, serial numbers and filing dates: "THERMAL INTERFACE MATERIAL AND METHOD FOR MANUFACTURING SAME" with application Ser. No. 11/024,513, filed on Dec. 28, 2004; "METHOD FOR MANUFACTURING CARBON NANOTUBES WITH UNIFORM LENGTH" with application Ser. No. 11/025,160, filed on Dec. 28, 2004; "THERMAL INTERFACE MATERIAL AND METHOD FOR MANUFACTURING SAME" with application Ser. No. 11/089,864, filed on Mar. 25, 2005; "THERMAL INTERFACE MATERIAL AND METHOD FOR MAKING SAME" with application Ser. No. 11/321,315, filed on Dec. 29, 2005; "THERMAL INTERFACE MATERIAL AND METHOD FOR MANUFACTURING SAME" with application Ser. No. 11/321,278, filed on Dec. 29, 2005; and "METHOD FOR MANUFACTURING A THERMAL INTERFACE MATERIAL" with application Ser. No. 11/321,316, filed on Dec. 29, 2005. Each of the six corresponding U.S. patent applications has the same assignee as the instant application. The disclosures of the above-identified applications are incorporated herein by reference.

TECHNICAL FIELD

The present invention relates to thermal interface materials and manufacturing methods thereof; and more particularly to a thermal interface material which conducts heat by using carbon nanotubes, and a manufacturing method thereof.

BACKGROUND

Electronic components such as semiconductor chips are becoming progressively smaller with successive new product releases, while at the same time heat dissipation requirements thereof are increasing. Commonly, a thermal interface material is utilized between the electronic component and a heat sink in order to efficiently dissipate heat generated by the electronic component.

A conventional thermal interface material is made by diffusing particles with a high heat conduction coefficient in a base material. The particles can be made of graphite, boron nitride, silicon oxide, alumina, silver, or other metals. However, a heat conduction coefficient of this kind of thermal interface material is now considered to be too low for many contemporary applications, because it cannot adequately meet the heat dissipation requirements of modern electronic components.

An article entitled "Unusually High Thermal Conductivity of Carbon Nanotubes" and authored by Savas Berber (page 4613, Vol. 84, Physical Review Letters 2000) discloses that a heat conduction coefficient of a carbon nanotube can be 6600 W/m·K (watts/meter·Kelvin) at room temperature.

A kind of thermal interface material which conducts heat by using carbon nanotubes has been developed. The thermal interface material is formed by injection molding, and has a plurality of carbon nanotubes incorporated in a matrix material. A first surface of the thermal interface material engages with an electronic device, and an opposite second surface of the thermal interface material engages with a heat sink. The second surface has a larger area than the first surface, so that heat can be uniformly spread over the larger second surface. However, the thermal interface material is generally formed by injection molding, and is relatively thick. This increases a bulk of the thermal interface material and reduces its flexibility. Furthermore, the carbon nanotubes are disposed in the matrix material randomly and multidirectionally. This means that heat does not necessarily spread uniformly through the thermal interface material. In addition, the heat does not necessarily spread directly from the first surface engaged with the electronic device to the second surface engaged with the heat sink.

To overcome the above-described problems, a method for producing a thermal interface structure having aligned carbon nanotubes has been developed. In a batch process, a capacitor is immersed in a bath of a slurry of thermoplastic polymer containing randomly oriented carbon nanotubes, and capacitor plates are adjusted to a desired spacing between them to provide a particular film thickness. Prior to curing of a preform of the thermal interface structure, the preform is energized to create an electrical field to orient the carbon nanotubes in a uniform direction in the polymer. Upon curing, the carbon nanotubes are embedded in the polymer in the desired alignment.

However, even though the thermal interface structure's thermal conductivity may be enhanced, it still may not be satisfactory for some applications. It is believed that one important reason limiting the thermal conductivity is the existence of thermal interface resistance where adjacent carbon nanotubes in any given heat conduction path within the thermal interface structure adjoin each other. In particular, where a heat conduction path comprises a plurality of such thermal interface resistance junctions, the overall thermal resistance along the entire heat conduction path may be significant.

What is needed, therefore, is a thermal interface material with good thermal conductivity. What is also needed is a method for manufacturing such kind of thermal interface material.

SUMMARY

In a preferred embodiment, a thermal interface material includes a plurality of carbon nanotubes each having a first end and an opposite second end, a heat current collector covering one of the first ends and the second ends of the carbon nanotubes, and a macromolecular material filled in spaces between the carbon nanotubes and heat current collector.

In another preferred embodiment, a method for manufacturing a thermal interface material includes the steps of: providing a plurality of carbon nanotubes each having a first end and an opposite second end; covering a heat current collector on the first ends, or covering two heat current collectors on the first and second ends of the carbon nanotubes respectively; and filling spaces among the carbon nanotubes and the heat current collector(s) with a macromolecular material.

Other advantages and novel features will become more apparent from the following detailed description when taken in conjunction with the accompanying drawings.

BRIEF DESCRIPTION OF THE DRAWINGS

The components in the drawings are not necessarily to scale, the emphasis instead being placed upon clearly illustrating the principles of the present invention. Moreover, in the drawings, like reference numerals designate corresponding parts throughout the several views.

FIG. 1 is a schematic, side view of a thermal interface material in accordance with a first preferred embodiment of the present invention, the thermal interface material having a heat current collector.

FIG. 2 is a schematic, side view of a thermal interface material in accordance with a second preferred embodiment of the present invention, the thermal interface material having two heat current collectors.

FIG. 3 is a flow chart of a method for manufacturing the thermal interface material of FIG. 1 or FIG. 2 in accordance with a third preferred embodiment of the present invention.

FIG. 4 is a schematic, side view of a carbon nanotube array formed on a substrate in accordance with the third preferred embodiment.

DETAILED DESCRIPTION OF PREFERRED EMBODIMENTS

Figure 5:
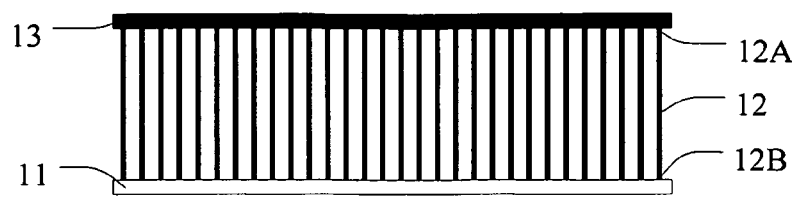
FIG. 5 is similar to FIG. 4, but showing a heat current collector provided on one end of the carbon nanotube array in accordance with the third preferred embodiment.
Figure 6:
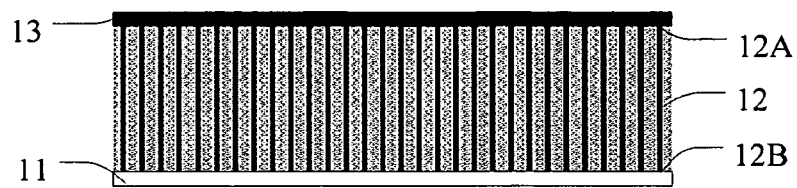
FIG. 6 is similar to FIG. 5, but showing the structure filled with a macromolecular material.

Embodiments of the present invention will now be described in detail below and with reference to the drawings. The exemplifications set out herein illustrate various preferred embodiments of the invention, in various forms, and such exemplifications are not to be construed as limiting the scope of the invention in any manner.

Referring to FIG. 1, a thermal interface material 10 according to a first preferred embodiment is shown. The thermal interface material 10 includes a plurality of carbon nanotubes 12 each having a first end 12A and an opposite second end 12B, a heat collector or a heat current collector 13 covering the first ends 12A of the carbon nanotubes 12, and a macromolecular material 15 filled in spaces among the carbon nanotubes 12 and heat current collector 13. The heat current collector 13 extends along a predetermined plane in which the second end 12B of each carbon nanotubes 12 reaches to commonly define.

The plurality of carbon nanotubes 12 can be in the form of a carbon nanotube array. Preferably, the carbon nanotubes 12 are substantially parallel to each other and perpendicular to the heat current collector 13. The heat current collector 13 can be made from a material selected from the group comprising aluminum (Al), copper (Cu), iron (Fe), gold (Au), silver (Ag), and any suitable alloy thereof. The heat current collector 13 can be a metal film, and the metal film can have a thickness in the range from 1 micron to 10 microns. The macromolecular material 15 can be selected from the group comprising silica gel, polyethylene glycol, polyester, epoxy resin, and acrylic. In the first preferred embodiment, the heat current collector 13 is an Al film, and PDMS (polydimethylsiloxane) is used as the macromolecular material 15.

Referring to FIG. 2, a thermal interface material 20 according to a second preferred embodiment is shown. The thermal interface material 20 is similar to the thermal interface material 10 of the first embodiment. However, the thermal interface material 20 further includes another heat current collector 13 covering the second ends 12B of the carbon nanotubes 12.

Referring to FIG. 3, a method for manufacturing material of a thermal interface according to a third preferred embodiment is provided. The method comprises the steps of:
(1) providing a plurality of carbon nanotubes each having a first end and an opposite second end;
(2) covering a heat current collector on the first ends of the carbon nanotubes, or covering two heat current collectors on the first ends of the carbon nanotubes and the second ends of the carbon nanotubes respectively; and
(3) filling spaces among the carbon nanotubes and the heat current collector(s) with a macromolecular material.

Referring to FIG. 4 through FIG. 7, the method for making material of the thermal interface in accordance with the third preferred embodiment is described in detail below including with reference to various embodiments thereof.

Step (1): Providing a plurality of carbon nanotubes 12 each having a first end 12A and an opposite second end 12B. In one embodiment, the plurality of carbon nanotubes 12 are providing by forming a carbon nanotube array on a substrate 11. The substrate 11 is made from a material selected from the group comprising glass, silicon, metal, and metal oxide. Preferably, the substrate 11 is made of silicon. The plurality of carbon nanotubes 12 are formed by one of a chemical vapor deposition method, a plasma chemical vapor deposition method, a plasma-enhanced hot filament chemical vapor deposition method, and a printing method. Preferably, a chemical vapor deposition method is used, for example as follows. Firstly, a catalyst (not shown) is formed on the substrate 11, and then the plurality of carbon nanotubes 12 are formed on the catalyst by providing a carbon source gas at a temperature suitable for growing of carbon nanotubes. The catalyst can be made from a material selected from the group comprising iron (Fe), cobalt (Co), nickel (Ni), palladium (Pd), etc. The carbon source gas can be methane, ethylene, propylene, acetylene, methanol, or ethanol. Detailedly, an iron film having a thickness of 5 nm is coated on the substrate 11, and is annealed in air at 300 degrees Celsius to thereby form the catalyst. Then the substrate 11 with the catalyst disposed thereon is placed in a chemical vapor deposition chamber (not shown), and ethylene (a carbon source gas) is provided in the chemical vapor deposition chamber at a temperature of 700 degrees Celsius to grow the plurality of carbon nanotubes 12. The carbon nanotubes 12 are grown substantially perpendicularly on the substrate 11.

Step (2): Covering a heat current collector 13 on the first ends 12A of the carbon nanotubes 12, or covering two heat current collectors 13 on the first ends 12A of the carbon nanotubes 12 and the second ends 12B of the carbon nanotubes 12 respectively. The heat current collector(s) 13 can be made from a material selected from the group comprising aluminum (Al), copper (Cu), iron (Fe), gold (Au), silver (Ag), and any suitable alloy thereof. The heat current collector(s) 13 can be a metal film, with the metal film having a thickness in the range from 1 micron to 10 microns. The heat current collector(s) 13 is formed by one of an electron beam evaporation method, a chemical plating method, and an electric plating method. In one embodiment whereby the thermal interface material 10 is eventually formed, an Al film having a thickness of 1 micron is formed on the first ends 12A of the carbon nanotubes 12 as a preform of the heat current collector 13 by an electron beam evaporation method. With the thickness of 1 micron, the evaporated Al can substantially cover the first ends 12A of the carbon nanotubes 12, forming a film of fine particles of Al tightly coupled with the first ends 12A.

Figure 7:
FIG. 7 is similar to FIG. 4, but showing two heat current collectors provided on two ends of the carbon nanotube array in accordance with the third preferred embodiment.

Preferably, the array of carbon nanotubes 12 together with the heat current collector 13 is then annealed in argon gas (Ar) at 250 degrees Celsius. Thereby, grain sizes of the fine particles of Al are enlarged, and the fine particles of Al couple with each other more tightly. Referring to FIG. 7, in another embodiment whereby the thermal interface material 20 is eventually formed, the substrate 11 can be removed, and another heat current collector 13 can be formed on the second ends 12B of the carbon nanotubes 12 using the same method as described above. Thereby, an array of carbon nanotubes 12 having two heat current collectors 13 on the first ends 12A and on the second ends 12B respectively is formed.

Step (2): Filling spaces among the carbon nanotubes 12 and the heat current collector(s) 13 with a macromolecular material 15. The filling step is performed by immersing the array of carbon nanotubes 12 having the heat current collector(s) 13 into a melt or solution of the macromolecular material 15. Then the macromolecular material 15 filled in the spaces between the carbon nanotubes 12 is cured in vacuum. The macromolecular material 15 can be selected from the group comprising silica gel, polyethylene glycol, polyester, epoxy resin, and acrylic. Preferably, PDMS is used as the macromolecular material 15. In detail, the array of carbon nanotubes 12 having the heat current collector(s) 13 is immersed into a melt of PDMS, then taken out, and then cured to room temperature. Thus the PDMS is filled in the spaces between the carbon nanotubes 12 and the heat current collector(s) 13. In one embodiment whereby the thermal interface material 10 is eventually formed, the substrate 11 connected with the second ends 12B of the carbon nanotubes 12 is then removed. Thereby, the thermal interface material 10 is obtained. In another embodiment whereby the thermal interface material 20 is formed, the thermal interface material 20 is obtained as soon as the array of carbon nanotubes 12 having the two heat current collectors 13 and the PDMS is cured to room temperature.

Figure 8:
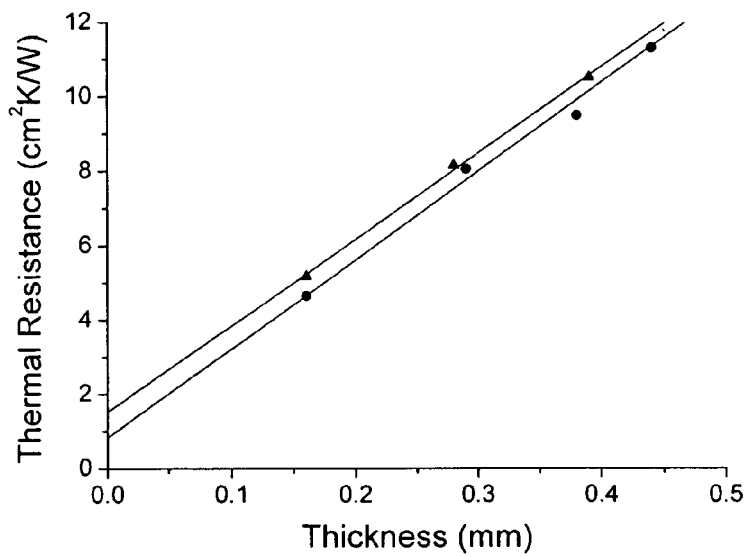
FIG. 8 is a graph illustrating a relationship between total thermal resistance and thickness of each of two thermal interface materials, one of the thermal interface materials being in accordance with the first preferred embodiment, and the other thermal interface material being in accordance with the first preferred embodiment but without the heat current collector.

An ASTM-D5470 (ASTM, American Society for Testing and Materials) method has been employed for measuring two thermal interface materials; namely, the thermal interface material 10 in accordance with the first preferred embodiment, and a thermal interface material similar to the thermal interface material 10 but without the heat current collector 13. During the measuring process, samples of the two thermal interface materials with different thicknesses are measured, and a thermal resistance-thickness graph can be plotted from the results of the measurements. Referring to FIG. 8, the triangular symbols represent results for the thermal interface material without the heat current collector, and the circular symbols represent results for the thermal interface material 10. The results can be extrapolated to form two straight lines, each of which satisfies the following condition:

$$R_{int} = R_{cont} + d/k$$

wherein, $R_{int}$ is a total thermal resistance of the thermal interface material, $R_{cont}$ is a contact thermal resistance of the thermal interface material, d is a thermal conductivity of the thermal interface material, and k is a thickness of the thermal interface material.

FIG. 8 shows that the thermal conductivities (the inverse of the slopes of the two straight lines) of the two thermal interface materials are basically the same. However, the contact thermal resistance of the thermal interface material 10 is 0.83 $cm^2K/W$ (square centimeter Kelvin per watt), while the contact thermal resistance of the thermal interface material without the heat current collector is 1.52 $cm^2K/W$. That is, the contact thermal resistance of a thermal interface material can be significantly reduced by introducing the heat current collector 13.

As detailed above, the thermal interface material 10 in accordance with the first preferred embodiment employs the heat current collector 13. The heat current collector 13 substantially covers the first ends 12A of the carbon nanotubes 12. Not only are the carbon nanotubes 12 fully utilized for their heat conduction properties, but also the effective contact surface of the carbon nanotubes 12 can be increased. The contact thermal resistance is thereby reduced, while the thermal conductivity of the thermal interface material 10 is maintained undiminished. The thermal interface material 20 has two heat current collectors 13 substantially covering the first ends 12A and the second ends 12B of the carbon nanotubes 12 respectively. For similar reasons, the thermal interface material 20 has advantages that are the same or even superior to those of the thermal interface material 10.

It is to be noted that the above-described method for manufacturing a thermal interface material is not limited to manufacturing a thermal interface material employing carbon nanotubes. The method can also be adapted for manufacturing other kinds of composite thermal interface materials which employ other kinds of heat conductive materials such as carbon fibers or other suitable materials.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A thermal interface material comprising:
a plurality of carbon nanotubes each having a first end and an opposite second end;
a first aluminum film, the first ends of the carbon nanotubes being embedded in the first aluminum film;
a macromolecular material filled in spaces among the carbon nanotubes; and
a second aluminum film, the second ends of the carbon nanotubes being embedded in the second aluminum film, wherein the macromolecular material is filled in spaces among the carbon nanotubes between the first aluminum film and the second aluminum film.

2. The thermal interface material in accordance with claim 1, wherein the first aluminum film has a thickness in a range from 1 micron to 10 microns.

3. The thermal interface material in accordance with claim 1, wherein the carbon nanotubes are substantially perpendicular to the first aluminum film.

4. The thermal interface material in accordance with claim 1, wherein the carbon nanotubes extend substantially perpendicularly from the first aluminum film to the second aluminum film.

5. The thermal interface material in accordance with claim 1, wherein the first aluminum film extends along a predetermined plane.

6. The thermal interface material in accordance with claim 1, wherein the macromolecular material is selected from the group comprising silica gel, polyethylene glycol, polyester, epoxy resin, and acrylic.

7. A thermal interface material comprising:
a first aluminum film;
a carbon nanotube array having a first end and an opposite second end, the first end being embedded in the first aluminum film;

a second aluminum film, wherein the second end is embedded in the second aluminum film; and a macromolecular material filled in spaces of the carbon nanotube array between the first aluminum film and the second aluminum film.

8. The thermal interface material in accordance with claim 7, wherein the macromolecular material is selected from the group comprising silica gel, polyethylene glycol, polyester, epoxy resin, and acrylic.

9. A thermal interface material comprising:
a first aluminum film;
a second aluminum film;
an array of carbon fibers each having a first end embedded in the first aluminum film and an opposite second end embedded in the second aluminum film; and a macromolecular material filled in spaces among the array of carbon fibers between the first aluminum film and the second aluminum film.

10. The thermal interface material in accordance with claim 9, wherein the macromolecular material is selected from the group comprising silica gel, polyethylene glycol, polyester, epoxy resin, and acrylic.

* * * * *